US012756366B2

(12) United States Patent
Jiang et al.

(10) Patent No.: US 12,756,366 B2
(45) Date of Patent: Oct. 6, 2026

(54) MATCHING NETWORK FOR A POWER AMPLIFIER

(71) Applicant: QUALCOMM Incorporated, San Diego, CA (US)

(72) Inventors: Kai Jiang, Santa Clara, CA (US); Sean Joel Lyn, Cupertino, CA (US); Shahram Abdollahi-Alibeik, Los Gatos, CA (US); Amit Jha, Cupertino, CA (US); Hyun Min Park, Belmont, CA (US)

(73) Assignee: QUALCOMM Incorporated, San Diego, CA (US)

( * ) Notice: Subject to any disclaimer, the term of this patent is extended or adjusted under 35 U.S.C. 154(b) by 395 days.

(21) Appl. No.: 18/587,536

(22) Filed: Feb. 26, 2024

(65) Prior Publication Data

US 2025/0274087 A1 Aug. 28, 2025

(51) Int. Cl.

*H03F 1/56* (2006.01)
*H03F 3/24* (2006.01)
*H04B 1/04* (2006.01)

(52) U.S. Cl.

CPC ............. *H03F 1/565* (2013.01); *H03F 3/245* (2013.01); *H04B 1/0458* (2013.01); *H03F 2200/451* (2013.01); *H03F 2200/534* (2013.01); *H03F 2200/541* (2013.01); *H04B 2001/0408* (2013.01)

(58) Field of Classification Search

CPC ... H03F 1/56; H03F 1/565; H03F 3/20; H03F 3/24; H03F 3/245; H03F 2200/318; H03F 2200/451; H03F 2200/534; H04B 1/04508; H04B 2001/0408

See application file for complete search history.

(56) References Cited

U.S. PATENT DOCUMENTS 11,533,075 B1 * 12/2022 Yu ............................ H03F 3/72
2019/0173439 A1 * 6/2019 Dunworth ............ H03F 1/0261

* cited by examiner

*Primary Examiner* — Long Nguyen
(74) *Attorney, Agent, or Firm* — Patterson + Sheridan LLP

(57) ABSTRACT

Methods and apparatus for transferring a signal from a first stage of an amplification circuit to a second stage of an amplification circuit via a matching network are described. An example matching network generally includes a transformer, a first coil selectively coupled, inductively, to the transformer, and inductive path(s) coupled between a first input node and a first output node of the transformer. Each inductive path includes a respective second coil selectively coupled, inductively, to the transformer. The transformer includes: the first input node and a second input node for coupling to the first stage; the first output node and a second output node for coupling to the second stage; a primary winding coupled between the first input node and the second input node; and a secondary winding inductively coupled to the primary winding and coupled between the first output node and the second output node.

20 Claims, 7 Drawing Sheets

MATCHING NETWORK FOR A POWER AMPLIFIER

TECHNICAL FIELD

Certain aspects of the present disclosure generally relate to electronic circuits and, more particularly, to a matching network, such as an impedance matching network for a power amplifier for use in a transmitter architecture.

BACKGROUND

Wireless communication devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, Fifth Generation (5G) New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., WiFi), and the like.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include radio frequency front-end (RFFE) circuitry for processing and amplifying signals for transmission and reception. For example, the RFFE circuitry may include a power amplifier (PA) for amplifying a radio frequency signal for transmission. Moreover, a driver amplifier (DA) (also referred to as a "pre-PA") may be used to generate signals to drive an input of the PA.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include higher gain bandwidths, higher saturated output power, flatter gain response across a target frequency range, and improved quality (Q) factor of a power amplifier (PA).

Certain aspects of the present disclosure provide a matching network for an amplification circuit. The matching network includes a transformer. The transformer includes a first input node and a second input node for coupling to a first stage of the amplification circuit, a first output node and a second output node for coupling to a second stage of the amplification circuit, a primary winding coupled between the first input node and the second input node of the transformer, and a secondary winding inductively coupled to the primary winding and coupled between the first output node and the second output node of the transformer. The matching network also includes a first coil selectively coupled, inductively, to the transformer. The matching network further includes one or more first inductive paths coupled between the first input node and the first output node of the transformer. Each inductive path of the one or more first inductive paths includes a respective second coil selectively coupled, inductively, to the transformer.

Certain aspects of the present disclosure provide a wireless device. The wireless device includes a first amplifier, a second amplifier, and a matching network coupled between the first amplifier and the second amplifier. The matching network includes a transformer. The transformer includes a first input node and a second input node for coupling to a first output and a second output of the first amplifier, a first output node and a second output node for coupling to a first input and a second input of the second amplifier, a primary winding coupled between the first input node and the second input node of the transformer; and a secondary winding inductively coupled to the primary winding and coupled between the first output node and the second output node of the transformer. The matching network also includes a first coil selectively coupled, inductively, to the transformer. The matching network further includes one or more first inductive paths coupled between the first input node and the first output node of the transformer. Each inductive path of the one or more first inductive paths includes a respective second coil selectively coupled, inductively, to the transformer.

Certain aspects of the present disclosure provide a method of wireless communication. The method generally includes transferring a signal from a first amplifier to a second amplifier via a matching network. The matching network includes a transformer. The transformer includes a first input node and a second input node for coupling to a first output and a second output of the first amplifier, a first output node and a second output node for coupling to a first input and a second input of the second amplifier, a primary winding coupled between the first input node and the second input node of the transformer, and a secondary winding inductively coupled to the primary winding and coupled between the first output node and the second output node of the transformer. The transformer also includes a first coil selectively coupled, inductively, to the transformer. The transformer further includes one or more inductive paths coupled between the first input node and the first output node of the transformer. Each inductive path of the one or more inductive paths includes a respective second coil selectively coupled, inductively, to the transformer. The method also includes amplifying, via the second amplifier, the signal transferred via the matching network.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
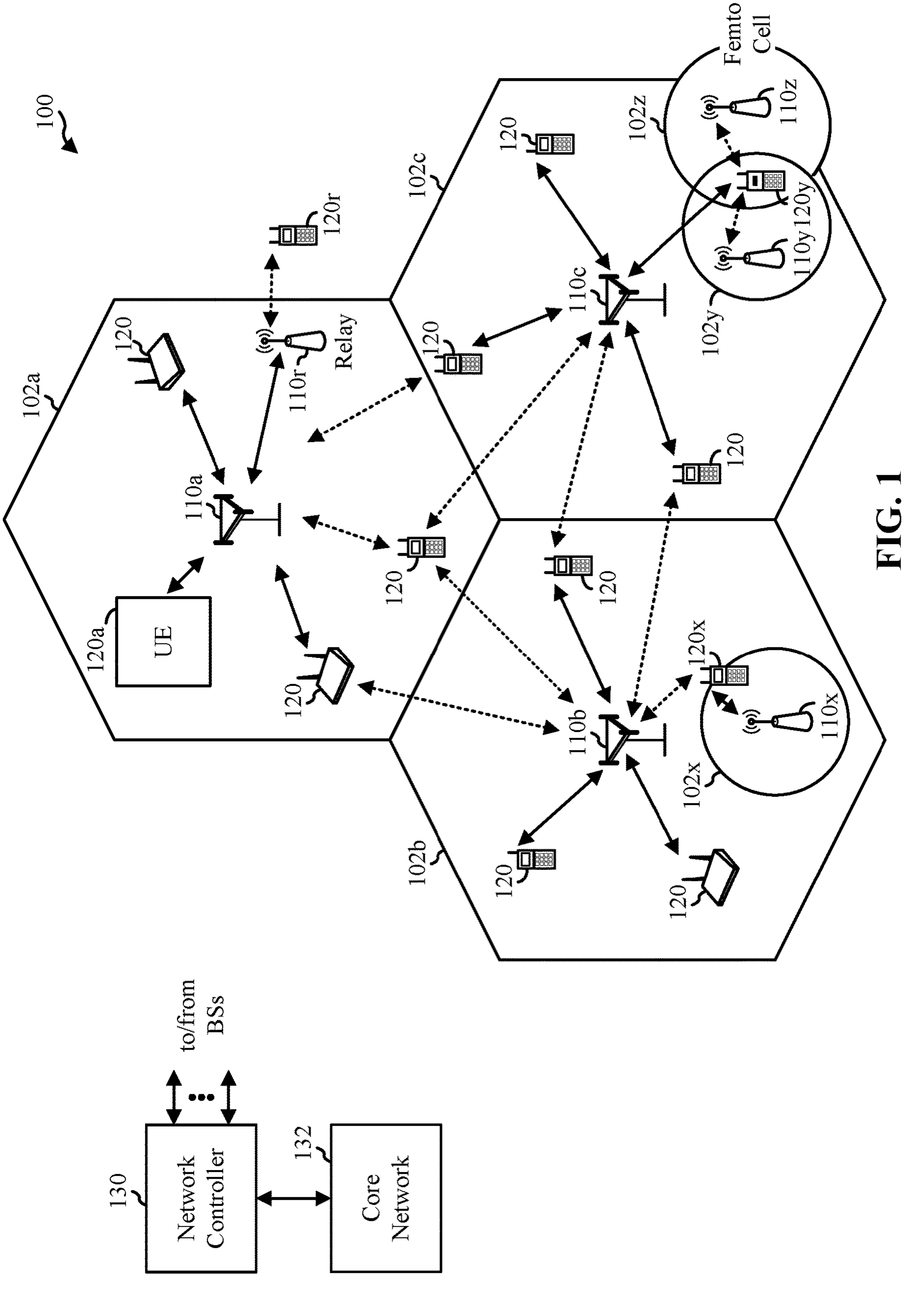
FIG. 1 is a diagram of an example wireless communications network, in which aspects of the present disclosure may be practiced.

Certain aspects of the present disclosure generally relate to electronic components and, more particularly, to an inter-stage matching network for an amplifier (e.g., power amplifier or "PA"). For example, the matching network described herein may be coupled between a first stage of an amplifier circuit and a second stage of the amplifier circuit. The first stage may include a first amplifier (e.g., a pre-power amplifier or "pre-PA"), and the second stage may include a second amplifier (e.g., a power amplifier or "PA"). As described in greater detail herein, the matching network may include, without limitation, a transformer, a first coil selectively coupled, inductively, to the transformer, and one or more inductive paths coupled between an input node and an output node of the transformer. Each inductive path may include a respective second coil that is selectively coupled, inductively, to the transformer.

The matching network may be used for impedance matching between stages of the multi-stage amplifier circuit. The matching network may allow for improved performance of an amplifier (e.g., PA) in terms of higher gain bandwidths, higher saturated output power (Psat), flatter gain response across the target frequency range, and improved (e.g., higher) quality factor (also referred to as "Q factor" or "Q"), as illustrative, non-limiting examples.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

FIG. 1 illustrates an example wireless communications network 100, in which aspects of the present disclosure may be practiced. For example, the wireless communications network 100 may be a New Radio (NR) system (e.g., a Fifth Generation (5G) NR network), a Sixth Generation (6G) cellular system, an Evolved Universal Terrestrial Radio Access (E-UTRA) system (e.g., a Fourth Generation (4G) network), a Universal Mobile Telecommunications System (UMTS) (e.g., a Second Generation/Third Generation (2G/3G) network), or a code division multiple access (CDMA) system (e.g., a 2G/3G network), or may be configured for communications according to an Institute of Electrical and Electronics Engineers (IEEE) standard such as one or more of the 802.11 standards, etc.

As illustrated in FIG. 1, the wireless communications network 100 may include a number of base stations (BSs) 110*a-z* (each also individually referred to herein as "BS 110" or collectively as "BSs 110") and other network entities. A BS may also be referred to as an access point (AP), an evolved Node B (eNodeB or eNB), a next generation Node B (gNodeB or gNB), or some other terminology.

A BS 110 may provide communication coverage for a particular geographic area, sometimes referred to as a "cell," which may be stationary or may move according to the location of a mobile BS. In some examples, the BSs 110 may be interconnected to one another and/or to one or more other BSs or network nodes (not shown) in wireless communications network 100 through various types of backhaul interfaces (e.g., a direct physical connection, a wireless connection, a virtual network, or the like) using any suitable transport network. In the example shown in FIG. 1, the BSs 110*a*, 110*b*, and 110*c* may be macro BSs for the macro cells 102*a*, 102*b*, and 102*c*, respectively. The BS 110*x* may be a pico BS for a pico cell 102*x*. The BSs 110*y* and 110*z* may be femto BSs for the femto cells 102*y* and 102*z*, respectively. A BS may support one or multiple cells.

The BSs 110 communicate with one or more user equipments (UEs) 120*a-y* (each also individually referred to herein as "UE 120" or collectively as "UEs 120") in the wireless communications network 100. A UE may be fixed or mobile and may also be referred to as a user terminal (UT), a mobile station (MS), an access terminal, a station (STA), a client, a wireless device, a mobile device, or some other terminology. A user terminal may be a wireless device, such as a cellular phone, a smartphone, a personal digital assistant (PDA), a handheld device, a wearable device, a wireless modem, a laptop computer, a tablet, a personal computer, etc.

The BSs 110 are considered transmitting entities for the downlink and receiving entities for the uplink. The UEs 120 are considered transmitting entities for the uplink and receiving entities for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink. $N_{up}$ UEs may be selected for simultaneous transmission on the uplink, $N_{dn}$ UEs may be selected for simultaneous transmission on the downlink. $N_{up}$ may or may not be equal to $N_{dn}$, and $N_{up}$ and $N_{dn}$ may be static values or can change for each scheduling interval. Beam-steering or some other spatial processing technique may be used at the BSs 110 and/or UEs 120.

The UEs 120 (e.g., 120*x*, 120*y*, etc.) may be dispersed throughout the wireless communications network 100, and each UE 120 may be stationary or mobile. The wireless communications network 100 may also include relay stations (e.g., relay station 110*r*), also referred to as relays or the like, that receive a transmission of data and/or other information from an upstream station (e.g., a BS 110*a* or a UE 120*r*) and send a transmission of the data and/or other information to a downstream station (e.g., a UE 120 or a BS 110), or that relays transmissions between UEs 120, to facilitate communication between devices.

The BSs 110 may communicate with one or more UEs 120 at any given moment on the downlink and uplink. The downlink (i.e., forward link) is the communication link from the BSs 110 to the UEs 120, and the uplink (i.e., reverse link) is the communication link from the UEs 120 to the BSs 110. A UE 120 may also communicate peer-to-peer with another UE 120.

The wireless communications network 100 may use multiple transmit and multiple receive antennas for data transmission on the downlink and uplink. BSs 110 may be equipped with a number Nap of antennas to achieve transmit diversity for downlink transmissions and/or receive diversity for uplink transmissions. A set Nu of UEs 120 may receive downlink transmissions and transmit uplink transmissions. Each UE 120 may transmit user-specific data to and/or receive user-specific data from the BSs 110. In general, each UE 120 may be equipped with one or multiple antennas. The Nu UEs 120 can have the same or different numbers of antennas.

The wireless communications network 100 may be a time division duplex (TDD) system or a frequency division duplex (FDD) system. For a TDD system, the downlink and uplink share the same frequency band. For an FDD system, the downlink and uplink use different frequency bands. The wireless communications network 100 may also utilize a single carrier or multiple carriers for transmission. Each UE 120 may be equipped with a single antenna (e.g., to keep costs down) or multiple antennas (e.g., where the additional cost can be supported).

A network controller 130 (also sometimes referred to as a "system controller") may be in communication with a set of BSs 110 and provide coordination and control for these BSs 110 (e.g., via a backhaul). In certain cases (e.g., in a 5G NR system), the network controller 130 may include a centralized unit (CU) and/or a distributed unit (DU). In certain aspects, the network controller 130 may be in communication with a core network 132 (e.g., a 5G Core Network (5GC)), which provides various network functions such as Access and Mobility Management, Session Management, User Plane Function, Policy Control Function, Authentication Server Function, Unified Data Management, Application Function, Network Exposure Function, Network Repository Function, Network Slice Selection Function, etc.

In certain aspects of the present disclosure, the BSs 110 and/or the UEs 120 may include a transceiver front end (TX/RX) (also known as a radio frequency front end (RFFE)), which includes a matching network coupled between a first amplifier (e.g., first stage of an amplifier circuit) and a second amplifier (e.g., second stage of the amplifier circuit). As described in more detail herein, the matching network may be implemented with a transformer, a first coil selectively coupled, inductively, to the transformer, and one or more inductive paths coupled between an input node and an output node of the transformer. Each inductive path may include a respective second coil that is selectively coupled, inductively, to the transformer.

Figure 2:
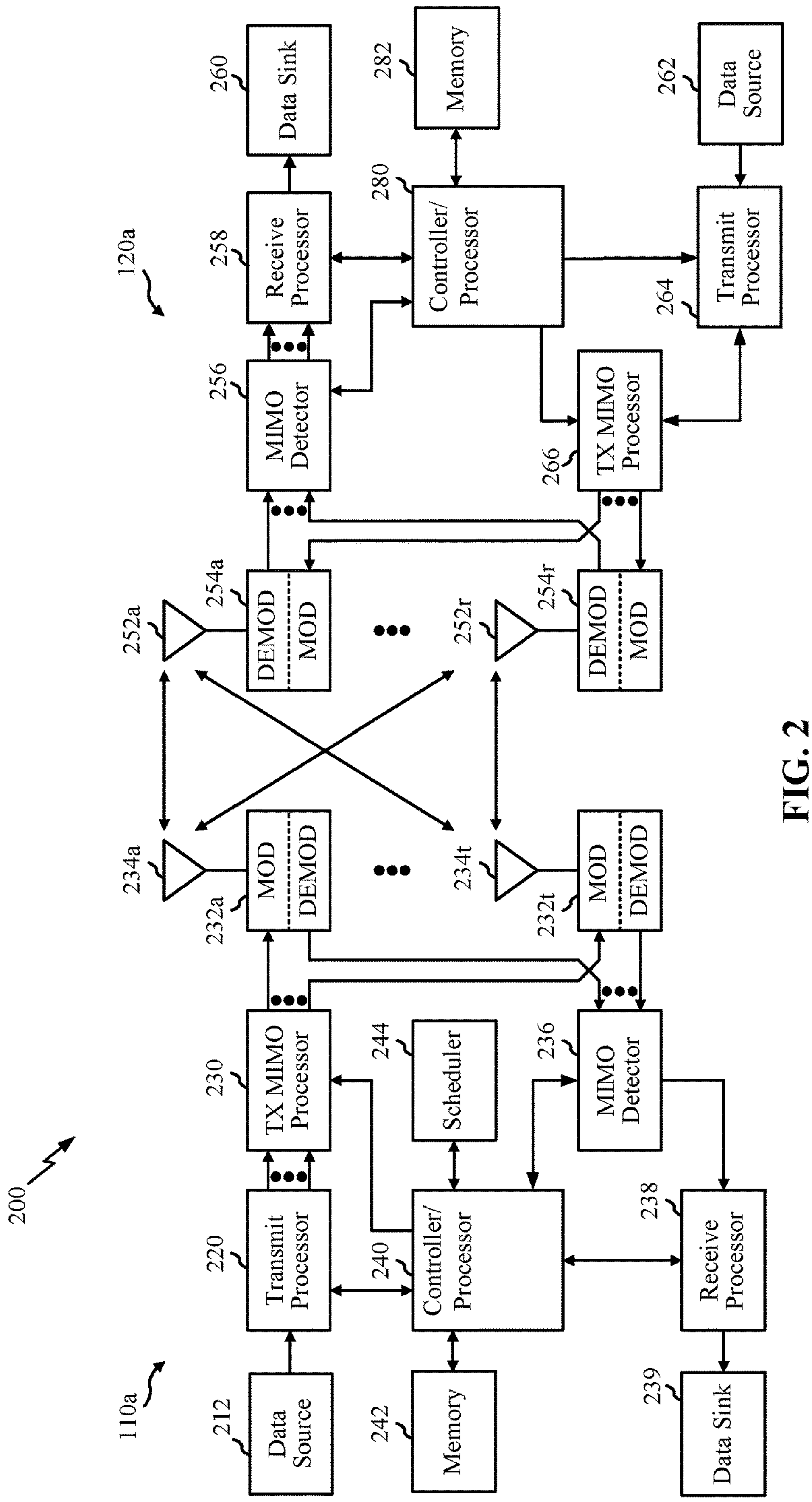
FIG. 2 is a block diagram conceptually illustrating a design of an example a base station (BS) and user equipment (UE), in which aspects of the present disclosure may be practiced.

FIG. 2 illustrates example components of BS 110*a* and UE 120*a* (e.g., from the wireless communications network 100 of FIG. 1), in which aspects of the present disclosure may be implemented.

On the downlink, at the BS 110*a*, a transmit processor 220 may receive data from a data source 212, control information from a controller/processor 240, and/or possibly other data (e.g., from a scheduler 244). The various types of data may be sent on different transport channels. For example, the control information may be designated for the physical broadcast channel (PBCH), physical control format indicator channel (PCFICH), physical hybrid automatic repeat request (HARQ) indicator channel (PHICH), physical downlink control channel (PDCCH), group common PDCCH (GC PDCCH), etc. The data may be designated for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a PDSCH, a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), PBCH, demodulation reference signal (DMRS), and channel state information reference signal (CSI-RS).

A transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232*a*-232*t*. Each modulator in transceivers 232*a*-232*t* may process a respective output symbol stream (e.g., for orthogonal frequency division multiplexing (OFDM), etc.) to obtain an output sample stream. Each of the transceivers 232*a*-232*t* may further process (e.g., convert to analog, amplify, filter, and upconvert) the output sample stream to obtain a downlink signal. Downlink signals from the transceivers 232a-232t may be transmitted via the antennas 234a-234t, respectively.

At the UE 120a, the antennas 252a-252r may receive the downlink signals from the BS 110a and may provide received signals to the transceivers 254a-254r, respectively. The transceivers 254a-254r may condition (e.g., filter, amplify, downconvert, and digitize) a respective received signal to obtain input samples. Each demodulator (DEMOD) in the transceivers 232a-232t may further process the input samples (e.g., for OFDM, etc.) to obtain received symbols. A MIMO detector 256 may obtain received symbols from all the demodulators in transceivers 254a-254r, perform MIMO detection on the received symbols if applicable, and provide detected symbols. A receive processor 258 may process (e.g., demodulate, deinterleave, and decode) the detected symbols, provide decoded data for the UE 120a to a data sink 260, and provide decoded control information to a controller/processor 280.

On the uplink, at UE 120a, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., the sounding reference signal (SRS)). The symbols from the transmit processor 264 may be precoded by a TX MIMO processor 266 if applicable, further processed by the modulators (MODs) in transceivers 254a-254r (e.g., for single-carrier frequency division multiplexing (SC-FDM), etc.), and transmitted to the BS 110a. At the BS 110a, the uplink signals from the UE 120a may be received by the antennas 234, processed by the demodulators in transceivers 232a-232t, detected by a MIMO detector 236 if applicable, and further processed by a receive processor 238 to obtain decoded data and control information sent by the UE 120a. The receive processor 238 may provide the decoded data to a data sink 239 and the decoded control information to the controller/processor 240.

The memories 242 and 282 may store data and program codes for BS 110a and UE 120a, respectively. The memories 242 and 282 may also interface with the controllers/processors 240 and 280, respectively. A scheduler 244 may schedule UEs for data transmission on the downlink and/or uplink.

Antennas 252, processors 258, 264, 266, and/or controller/processor 280 of the UE 120a and/or antennas 234, processors 220, 230, 238, and/or controller/processor 240 of the BS 110a may be used to perform the various techniques and methods described herein.

In certain aspects of the present disclosure, the transceivers 232 and/or the transceivers 254 may include a matching network coupled between a first amplifier (e.g., first stage of an amplifier circuit) and a second amplifier (e.g., second stage of the amplifier circuit). As described in more detail herein, the matching network may be implemented with a transformer, a first coil selectively coupled, inductively, to the transformer, and one or more inductive paths coupled between an input node and an output node of the transformer. Each inductive path may include a respective second coil that is selectively coupled, inductively, to the transformer.

NR may utilize orthogonal frequency division multiplexing (OFDM) with a cyclic prefix (CP) on the uplink and downlink. NR may support half-duplex operation using time division duplexing (TDD). OFDM and single-carrier frequency division multiplexing (SC-FDM) partition the system bandwidth into multiple orthogonal subcarriers, which are also commonly referred to as tones, bins, etc. Each subcarrier may be modulated with data. Modulation symbols may be sent in the frequency domain with OFDM and in the time domain with SC-FDM. The spacing between adjacent subcarriers may be fixed, and the total number of subcarriers may be dependent on the system bandwidth. The system bandwidth may also be partitioned into subbands. For example, a subband may cover multiple resource blocks (RBs).

Example RF Transceiver

Figure 3:
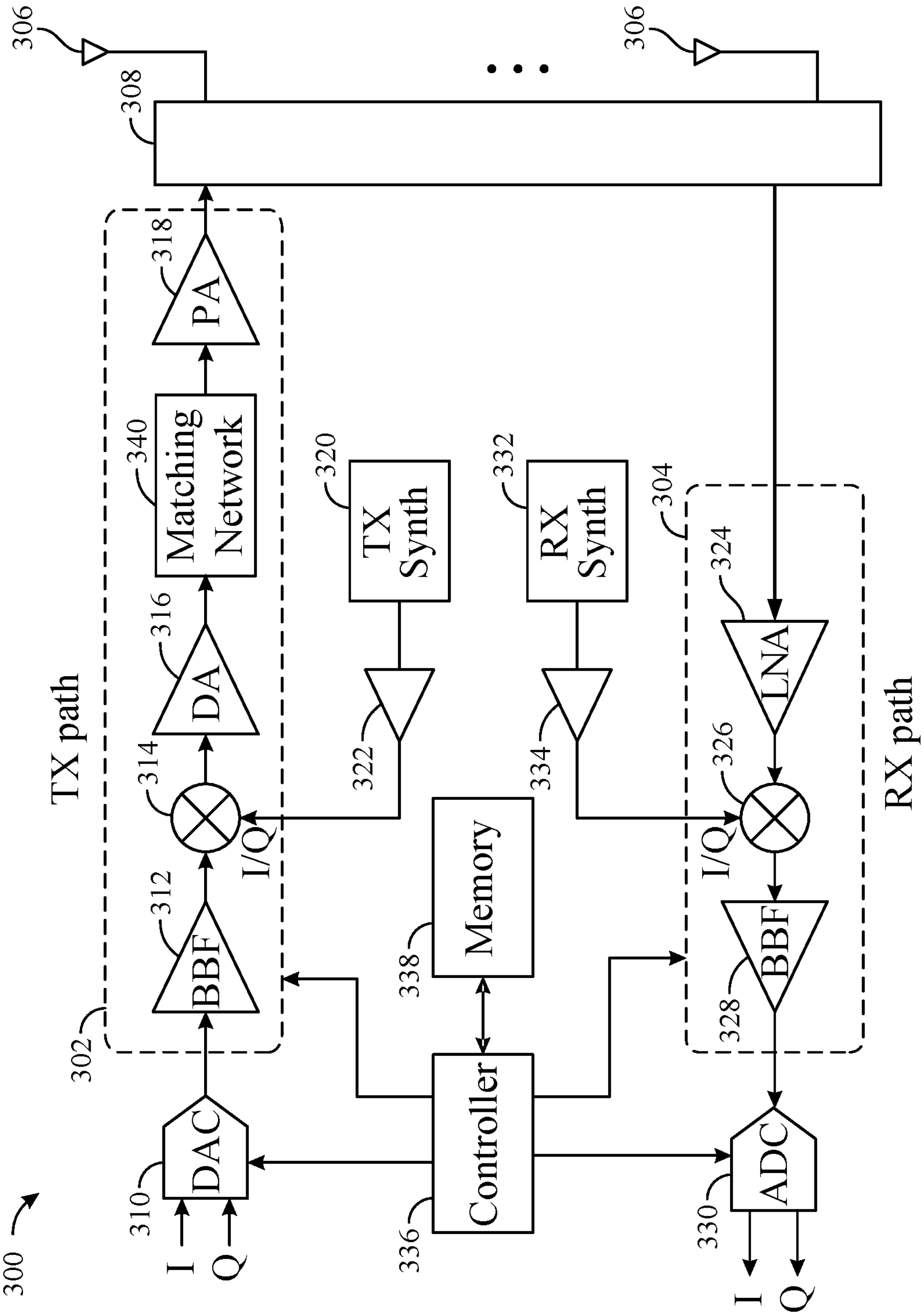
FIG. 3 is a block diagram of an example radio frequency (RF) transceiver, in which aspects of the present disclosure may be practiced.

FIG. 3 is a block diagram of an example radio frequency (RF) transceiver circuit 300, in accordance with certain aspects of the present disclosure. The RF transceiver circuit 300 includes at least one transmit (TX) path 302 (also known as a "transmit chain") for transmitting signals via one or more antennas 306 and at least one receive (RX) path 304 (also known as a "receive chain") for receiving signals via the antennas 306. When the TX path 302 and the RX path 304 share an antenna 306, the paths may be connected with the antenna via an interface 308, which may include any of various suitable RF devices, such as a switch, a duplexer, a diplexer, a multiplexer, and the like.

Receiving in-phase (I) and/or quadrature (Q) baseband analog signals from a digital-to-analog converter (DAC) 310, the TX path 302 may include a baseband filter (BBF) 312, a mixer 314, a driver amplifier (DA) 316, a matching network 340, and a power amplifier (PA) 318. The BBF 312, the mixer 314, the DA 316, the matching network 340, and the PA 318 may be included in a radio frequency integrated circuit (RFIC). For certain aspects, the PA 318 may be external to the RFIC. In such aspects, the RFIC (and thus the DA 316) may be coupled to the PA 318 over one or more interconnections, for example, a conductive line or cabling such as a coaxial cable or flex circuit.

The BBF 312 filters the baseband signals received from the DAC 310, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna(s) 306. While one mixer 314 is illustrated, several mixers may be used to upconvert the filtered baseband signals to one or more intermediate frequencies and to thereafter upconvert the intermediate frequency (IF) signals to a frequency for transmission.

The matching network 340 may transfer (amplified) signals (e.g., RF signals) output from the DA 316 to the PA 318, which may amplify the signals (e.g., RF signals) before transmission by the antenna(s) 306. The matching network 340 may be used for impedance matching between the DA 316 and PA 318. For example, the matching network 340 may be used to match an output impedance of the DA 316 to an input impedance of the PA 318. In some cases, impedance matching can be used to reduce losses and increase the power transferred from the DA 316 and PA 318 to the antenna(s) 306. In certain aspects, the matching network 340 may be implemented with a transformer, a first coil selectively coupled, inductively, to the transformer, and one or more inductive paths coupled between an input node and an output node of the transformer. Each inductive path may include a respective second coil that is selectively coupled, inductively, to the transformer.

The RX path 304 may include a low noise amplifier (LNA) 324, a mixer 326, and a baseband filter (BBF) 328. The LNA 324, the mixer 326, and the BBF 328 may be included in one or more RFICs, which may or may not be the same RFIC that includes the TX path components. RF signals received via the antenna(s) 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 320, which may be buffered or amplified by amplifier 322 before being mixed with the baseband signals in the mixer 314. Similarly, the receive LO may be produced by an RX frequency synthesizer 332, which may be buffered or amplified by amplifier 334 before being mixed with the RF signals in the mixer 326. For certain aspects, a single frequency synthesizer may be used for both the TX path 302 and the RX path 304. In certain aspects, the TX frequency synthesizer 320 and/or RX frequency synthesizer 332 may include a frequency multiplier, such as a frequency doubler, that is driven by an oscillator (e.g., a VCO) in the frequency synthesizer.

A controller 336 (e.g., controller/processor 280 in FIG. 2) may direct the operation of the RF transceiver circuit 300A, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 282 in FIG. 2) may store data and/or program codes for operating the RF transceiver circuit 300. The controller 336 and/or the memory 338 may include control logic (e.g., complementary metal-oxide-semiconductor (CMOS) logic).

While FIGS. 1-3 provide wireless communications as an example application in which certain aspects of the present disclosure may be implemented to facilitate understanding, certain aspects described herein may be used for power amplifier circuits in any of various other suitable systems (e.g., an audio system or other electronic system).

Example Matching Network for a Power Amplifier

As noted above, the PA 318 may be used to amplify signals (e.g., RF signals) before transmission by the antenna 306. One issue with some PA circuits is that these circuits can suffer breakdown and/or failure of circuit components when operated in certain conditions. In particular, large voltage swings across a power device (e.g., transistor(s)) of such a PA can degrade the ruggedness of the PA, causing part failure.

In certain cases, impedance matching can be used to improve the ruggedness of a PA. Implementing impedance matching can involve incorporating a matching network prior to the input of the PA to reduce losses and increase the power transferred to the PA. As illustrated in FIG. 3, for example, the matching network 340 is coupled between the DA 316 and PA 318. The DA 316 may be representative of a first stage of an amplifier circuit (and may be referred to herein as a "pre-PA"), and the PA 318 may be representative of a second stage of the amplifier circuit.

Figure 4:
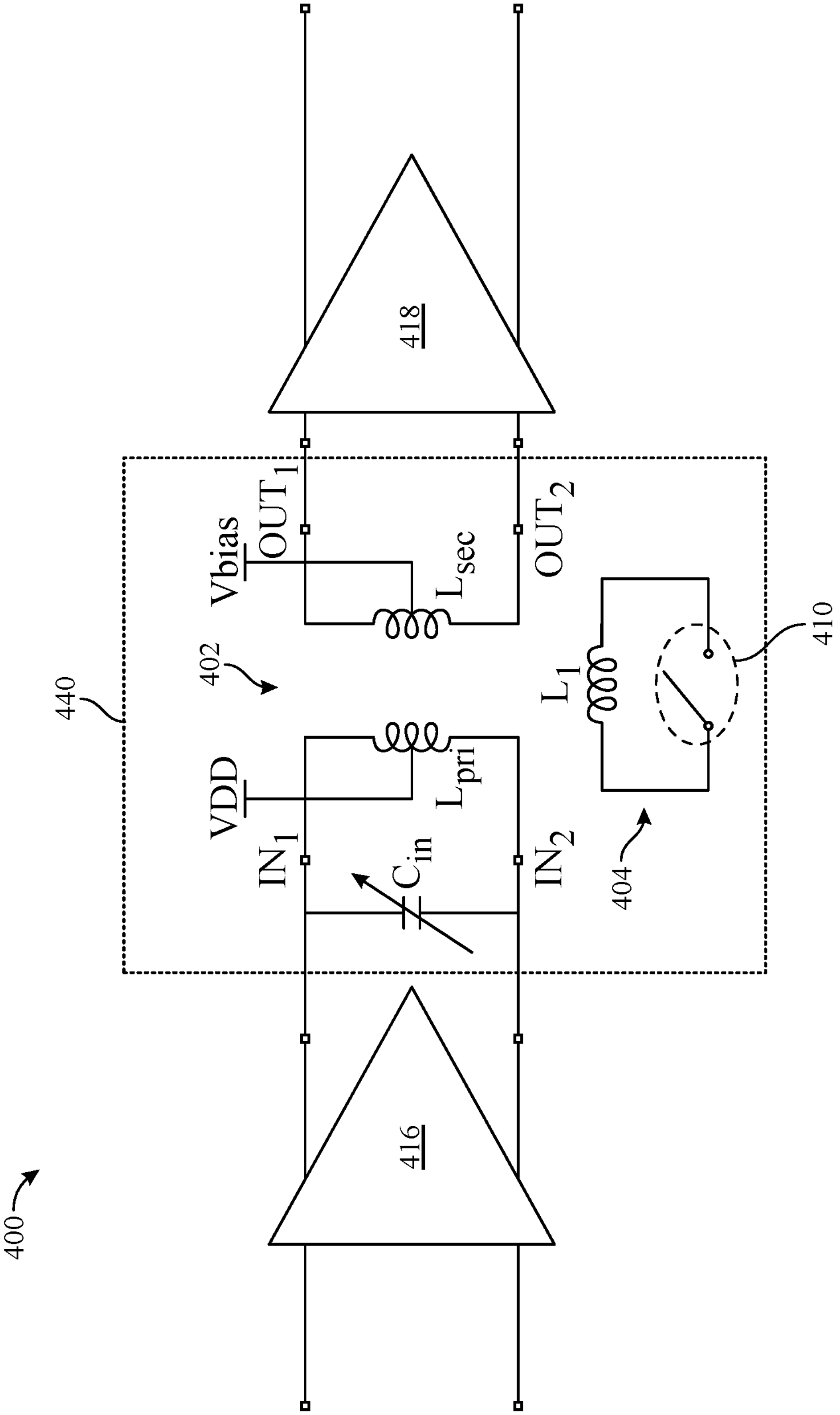
FIG. 4 illustrates an example amplifier circuit, in accordance with certain aspects of the present disclosure.

FIG. 4 illustrates an example amplifier circuit 400 (or amplification circuit) that may be included within an RF transceiver, such as RF transceiver circuit 300. The amplifier circuit 400 is one reference example of a multi-stage amplifier circuit with an interstage matching network. The amplifier circuit 400 includes, without limitation, an amplifier 416, a matching network 440, and an amplifier 418. The amplifier 416 may be used to implement the DA 316 of FIG. 3, the matching network 440 may be used to implement the matching network 340 of FIG. 3, and the amplifier 418 may be used to implement the PA 318 of FIG. 3.

As shown, the matching network 440 is coupled between the amplifier 416 (e.g., first stage) and the amplifier 418 (e.g., second stage). The matching network 440 is configured to transfer a signal from the amplifier 416 to the amplifier 418. For example, the matching network 440 may (a) receive, via a first input node ($IN_1$) and a second input node ($IN_2$) in the matching network 440, a dual-ended output from the amplifier 418, and (b) provide, via a first output node ($OUT_1$) and a second output node ($OUT_2$) in the matching network 440, the dual-ended output to the amplifier 418.

The matching network 440 includes a transformer 402, a switchable inductor ring 404, and tunable capacitive element $C_{in}$. The transformer 402 includes a primary winding ($L_{pri}$) and a secondary winding ($L_{sec}$). A center tap of the primary winding ($L_{pri}$) may be coupled to a supply voltage (e.g., a reference potential labeled "$V_{DD}$"). A center tap of the secondary winding ($L_{sec}$) may be coupled to a bias voltage (e.g., a reference potential labeled "$V_{bias}$"). The primary winding ($L_{pri}$) is coupled between the first input node ($IN_1$) and the second input node ($IN_2$) of the transformer 402. The secondary winding ($L_{sec}$) is coupled between the first output node ($OUT_1$) and the second output node ($OUT_2$) of the transformer 402. The tunable capacitive element $C_{in}$ is coupled in parallel with the primary winding ($L_{pri}$) of the transformer 402. In certain implementations, the amplifier 416 and/or the amplifier 418 may include an array of amplifier cells (or slices), where each amplifier cell (or slice) is implemented with a respective transistor. In these implementations, the transformer 402 may tap to the center of the respective array.

The switchable inductor ring 404 includes a coil $L_1$ and a switch 410. In some cases, at least a portion of the switchable inductor ring 404 (including the coil $L_1$ and/or switch 410) may be disposed around the primary winding ($L_{pri}$) and secondary winding ($L_{sec}$) of the transformer 402. The coil $L_1$ may be selectively coupled, inductively, to the transformer 402 via the switch 410. For example, the switch 410 may inductively couple the coil $L_1$ to the transformer 402 when the switch 410 is in a closed state, and may inductively decouple the coil $L_1$ from the transformer 402 when the switch 410 is in an open state. In certain cases, the switch 410 may be implemented by a transmission gate or any of other various suitable components, such as a field-effect transistor (FET) (with a p-type metal-oxide-semiconductor (PMOS) implementation or n-type metal-oxide-semiconductor (NMOS) implementation), negative-positive-negative (NPN) transistor, or positive-negative-positive (PNP)

transistor, as illustrative, non-limiting examples. In certain cases, the switch 410 may be configured to be in a closed state or open state in response to receiving a control signal from a controller, such as controller 336.

Note that the amplifier circuit 400 depicted in FIG. 4 is provided as a reference example of an amplifier circuit that may be included in an RF transceiver. For example, while the amplifier circuit 400 depicts the matching network 440 with a switchable inductor ring 404, aspects of the present disclosure may allow for implementing the matching network without a switchable inductor ring. For instance, such a matching network may be implemented with a transformer (e.g., similar to transformer 402) and a tunable capacitive element (e.g., similar to tunable capacitive element $C_{in}$).

In certain cases, the inductance of the transformer 402 may be reduced when the coil $L_1$ is inductively coupled to the transformer 402 (e.g., due to the switch 410 being in a closed state). For instance, in some cases, the inductive coupling between the coil $L_1$ and the transformer 402 may reduce the transformer inductance by approximately 50%, resonant with $C_{in}$ at higher frequencies. However, one potential drawback to using a matching network 440 with the switchable inductor ring 404 is that it can impact performance of the amplifier 418 in certain frequency bands (e.g., certain frequency bands associated with the 802.11be wireless communication standard, commonly referred to as "Wi-Fi 7").

For instance, while the inductive coupling between the coil $L_1$ and the transformer 402 (e.g., when switch 410 is in the closed state) may reduce the transformer inductance, this inductive coupling may also significantly reduce the Q factor (e.g., from 10 to 6). This decrease in the quality factor can cause gain variation and/or degradation in the amplifier 418.

Additionally, the inductive coupling between the coil $L_1$ and the transformer 402 may impact wideband operation of the amplifier 418. For example, there may be a reduction in the highest gain peak frequency that can be achieved by the amplifier 418. In one reference example, the highest gain peak frequency may be approximately 6.7 gigahertz (GHz), which is lower than the 6 GHz band edge (e.g., 7.25 GHZ) associated with 802.11be. Additionally, in some cases, there may be a large gain variation across frequency (e.g., greater than 4 dB gain variation) when the coil $L_1$ is inductively coupled to the transformer 402.

Additionally, in some cases, there may be a large degradation in the saturated output power (Psat) of the amplifier 418 when the coil $L_1$ is inductively coupled to the transformer 402. The Psat degradation may be more pronounced at higher frequencies (e.g., 7.25 GHZ).

Additionally, in cases where the amplifier 418 is implemented with an array of amplifier cells, the inductive coupling between the coil $L_1$ and the transformer 402 may result in a difference in the array impedance seen by one or more of the amplifier cells. For example, because the transformer 402 may tap to the center of the array, the amplifier cells (or slices) located away from the center (e.g., at the edge of the array) may be presented with a different input impedance (Zin) due to additional inductance from the long array input trace (e.g., metal routing). The difference in the input impedance seen by the amplifier cells may increase as the frequency increases, limiting the tuning range of the matching network 440.

To address the aforementioned technical challenges, certain aspects herein describe a matching network that is implemented, in part, with a transformer, a switchable inductor ring, and one or more independently controlled switchable inductor paths. Each switchable inductor path may include a respective coil that is selectively coupled, inductively, to the transformer. In certain aspects, the switchable inductor paths may be added at the edge(s) of the amplifier array input trace to enhance wideband operations.

Implementing the matching network described herein with the independently controlled switchable inductor paths may improve (e.g., extend) the peak gain frequency, flatten (e.g., decrease) the gain variation across frequency, increase the saturated output power (Psat) at higher frequencies, and improve the Q factor (without a significant degradation in Psat), as illustrative, non-limiting examples. For example, including the switchable inductor paths in the matching network can reduce the impact on the transformer inductance by the switchable inductor ring, which in turn, can reduce the degradation in the Q factor. In addition, implementing the matching network with independently controlled switchable inductor paths may allow for distributed impedance matching. The distributed impedance matching may provide a direct path to center PA array cells and edge PA array cells, mitigating the unwanted inductance edge PA array cells see due to the long array input trace.

Figure 5:
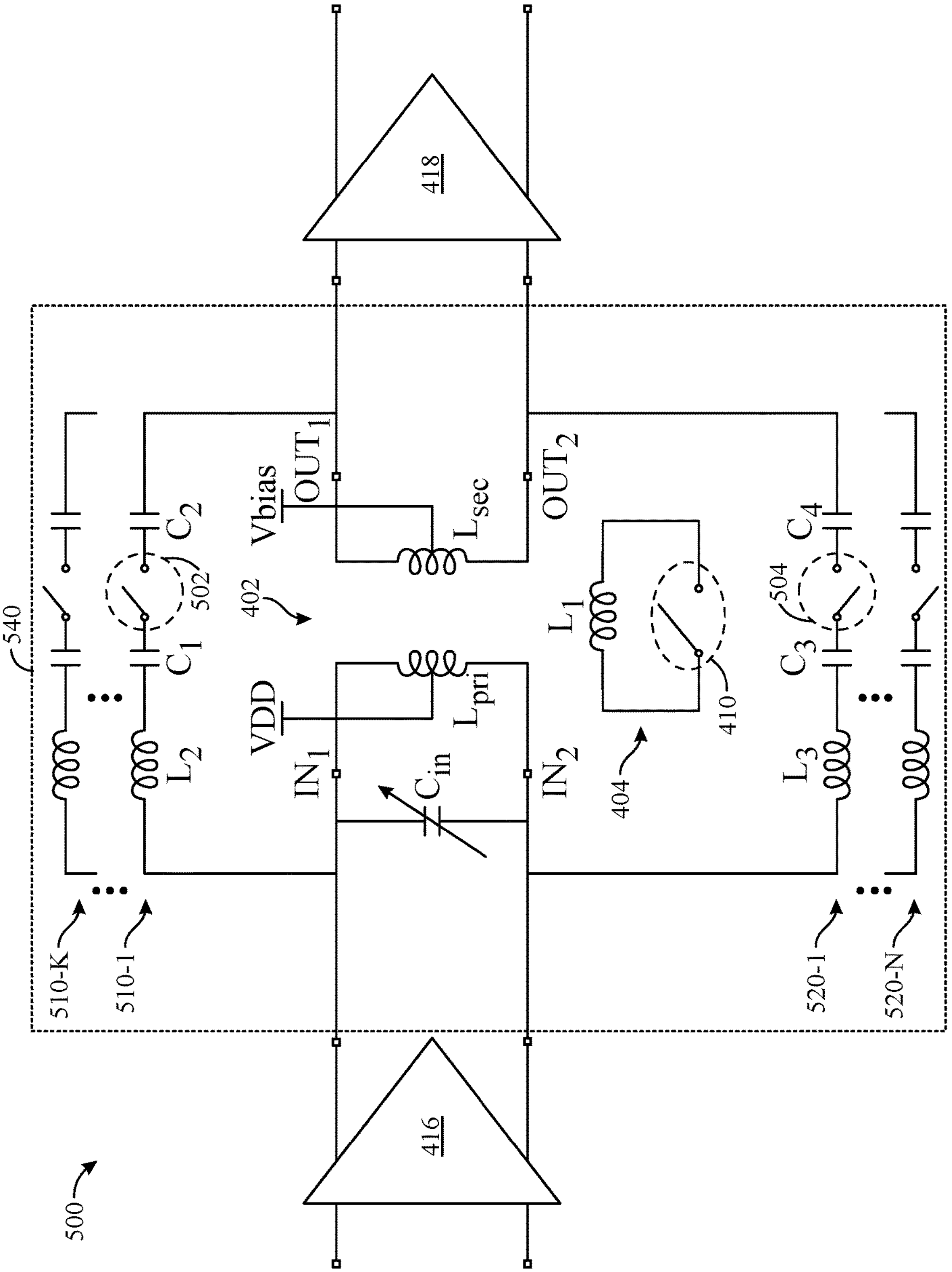
FIG. 5 illustrates another example amplifier circuit, in accordance with certain aspects of the present disclosure.

FIG. 5 illustrates an example amplifier circuit 500 (or amplification circuit) that may be included within an RF transceiver, such as RF transceiver circuit 300, according to certain aspects of the present disclosure. The amplifier circuit 500 is one reference example of a multi-stage amplifier circuit with an interstage matching network. Compared to amplifier circuit 400 of FIG. 4, the amplifier circuit 500 includes a matching network 540, which may be used to implement the matching network 340 of FIG. 3. Compared to the matching network 440 of FIG. 4, the matching network 540 also includes one or more one or more switchable inductor paths 510-1 to 510-K and one or more switchable inductor paths 520-1 to 520-N (e.g., in addition to the transformer 420 and the switchable inductor ring 404).

Each switchable inductor path 510 may be coupled between the first input node ($IN_1$) and the first output node ($OUT_1$) of the transformer 402. As shown, each inductor path 510 may include a coil $L_2$, a capacitive element $C_1$, a capacitive element $C_2$, and a switch 502. The capacitive element $C_1$ may be coupled between the coil $L_2$ and the switch 502, and the capacitive element $C_2$ may be coupled between the switch 502 and the first output node ($OUT_1$) of the transformer 402. One or more of the switchable inductor paths 510 may be located external to at least one of the primary winding ($L_{pri}$) or the secondary winding ($L_{sec}$) of the transformer 402. Additionally, in some cases, one or more of the switchable inductor paths 510 may be located external to the coil $L_1$ of the switchable inductor ring 404.

The respective coil $L_2$ within each inductor path 510 may be selectively coupled, inductively, to the transformer 402 via the respective switch 502 of the inductor path 510. For example, the switch 502 may inductively couple the coil $L_2$ to the transformer 402 when the switch 502 is in a closed state, and may inductively decouple the coil $L_2$ from the transformer 402 when the switch 502 is in an open state. In certain cases, when the switch 502 is in a closed state, there may be a finite mutual coupling between the coil $L_2$ and at least one of the transformer 402 or the coil $L_1$ (when switch 410 is in a closed state). In certain cases, the switch 502 may be implemented by a transmission gate or any of other various suitable components, such as a FET (with a PMOS implementation or NMOS implementation), NPN transistor, or PNP transistor, as illustrative, non-limiting examples. In certain cases, the switch 502 may be configured to be in a closed state or open state in response to receiving a control signal from a controller, such as controller 336. The capacitive elements $C_1$ and $C_2$ may allow for cross-biasing the switch 502, e.g., to prevent the switch 502 from inadvertently changing states. Additionally, in some cases, the capacitive elements $C_1$ and $C_2$ may be used as tuning capacitive elements to tune the impedance of the inductor path 510 (e.g., capacitive elements $C_1$ and $C_2$ may have small capacitor values to create a series LC tuning element when the switch 502 is in a closed state).

Each switchable inductor path 520 may be coupled between the second input node ($IN_2$) and the second output node ($OUT_2$) of the transformer 402. As shown, each inductor path 520 may include a coil $L_3$, a capacitive element $C_3$, a capacitive element $C_4$, and a switch 504. The capacitive element $C_3$ may be coupled between the coil $L_3$ and the switch 504, and the capacitive element $C_4$ may be coupled between the switch 504 and the second output node ($OUT_2$) of the transformer 402. One or more of the switchable inductor paths 520 may be located external to at least one of the primary winding ($L_{pri}$) or the secondary winding ($L_{sec}$) of the transformer 402. Additionally, in some cases, one or more of the switchable inductor paths 520 may be located external to the coil $L_1$ of the switchable inductor ring 404.

The respective coil $L_3$ within each inductor path 520 may be selectively coupled, inductively, to the transformer 402 via the respective switch 504 of the inductor path 520. For example, the switch 504 may inductively couple the coil $L_3$ to the transformer 402 when the switch 504 is in a closed state, and may inductively decouple the coil $L_3$ from the transformer 402 when the switch 504 is in an open state. In certain cases, when the switch 504 is in a closed state, there may be a finite mutual coupling between the coil $L_3$ and at least one of the transformer 402 or the coil $L_1$ (when switch 410 is in a closed state). In certain cases, the switch 504 may be implemented by a transmission gate or any of other various suitable components, such as a FET (with a PMOS implementation or NMOS implementation), NPN transistor, or PNP transistor, as illustrative, non-limiting examples. In certain cases, the switch 504 may be configured to be in a closed state or open state in response to receiving a control signal from a controller, such as controller 336. The capacitive elements $C_3$ and $C_4$ may allow for cross-biasing the switch 504, e.g., to prevent the switch 504 from inadvertently changing states. Additionally, in some cases, the capacitive elements $C_3$ and $C_4$ may be used as tuning capacitive elements to tune the impedance of the inductor path 520 (e.g., capacitive elements $C_3$ and $C_4$ may have small capacitor values to create a series LC tuning element when the switch 504 is in a closed state).

Note that the number of switchable inductor paths 510 may be the same as, or different than, the number of switchable inductor paths 520. For example, in some aspects, the number of switchable inductor paths 510 may be based on the number of edge amplifier cells located at or near a first end of the PA array, e.g., with respect to the center of the PA array. Similarly, the number of switchable inductor paths 520 may be based on the number of edge amplifier cells located at or near a second end of the PA array, e.g., with respect to the center of the PA array. In some cases, the matching network 540 may include a respective switchable inductor path 510 for each amplifier cell located at or near the first end of the PA array, and a respective switchable inductor path 510 for each amplifier cell located at or near the second end of the PA array. In one reference example, the switchable inductor path 510-1 may be located near a first edge of the PA array to mitigate unwanted inductance to which one or more of the edge amplifier cells in the PA array may be presented due to a long array input trace. Likewise, the switchable inductor path 520-1 may be located near a second opposite edge of the PA array to mitigate unwanted inductance to which one or more of the edge amplifier cells in the PA array may be presented due to the long array input trace.

Additionally, note that the amplifier circuit 500 depicted in FIG. 5 is provided as a reference example of an amplifier circuit that may be included in an RF transceiver. For example, while the amplifier circuit 500 depicts the matching network 540 with a switchable inductor ring 404, aspects of the present disclosure may allow for implementing the matching network without a switchable inductor ring. For instance, such a matching network may be implemented with a transformer (e.g., similar to transformer 402), a tunable capacitive element (e.g., similar to tunable capacitive element $C_{in}$), one or more first switchable inductor paths (e.g., similar to switchable inductor paths 510-1 to 510-K), and one or more second switchable inductor paths (e.g., similar to switchable inductor paths 520-1 to 520-N).

In certain aspects, each of the respective switches 502 of the switchable inductor paths 510, each of the respective switches 504 of the switchable inductor paths 520, and/or the switch 410 of the switchable inductor ring 404 may be independently controlled, via the controller 336. For example, each of the switches 502, 504, and 410 can be independently controlled to achieve a target amplifier performance.

Figure 6:
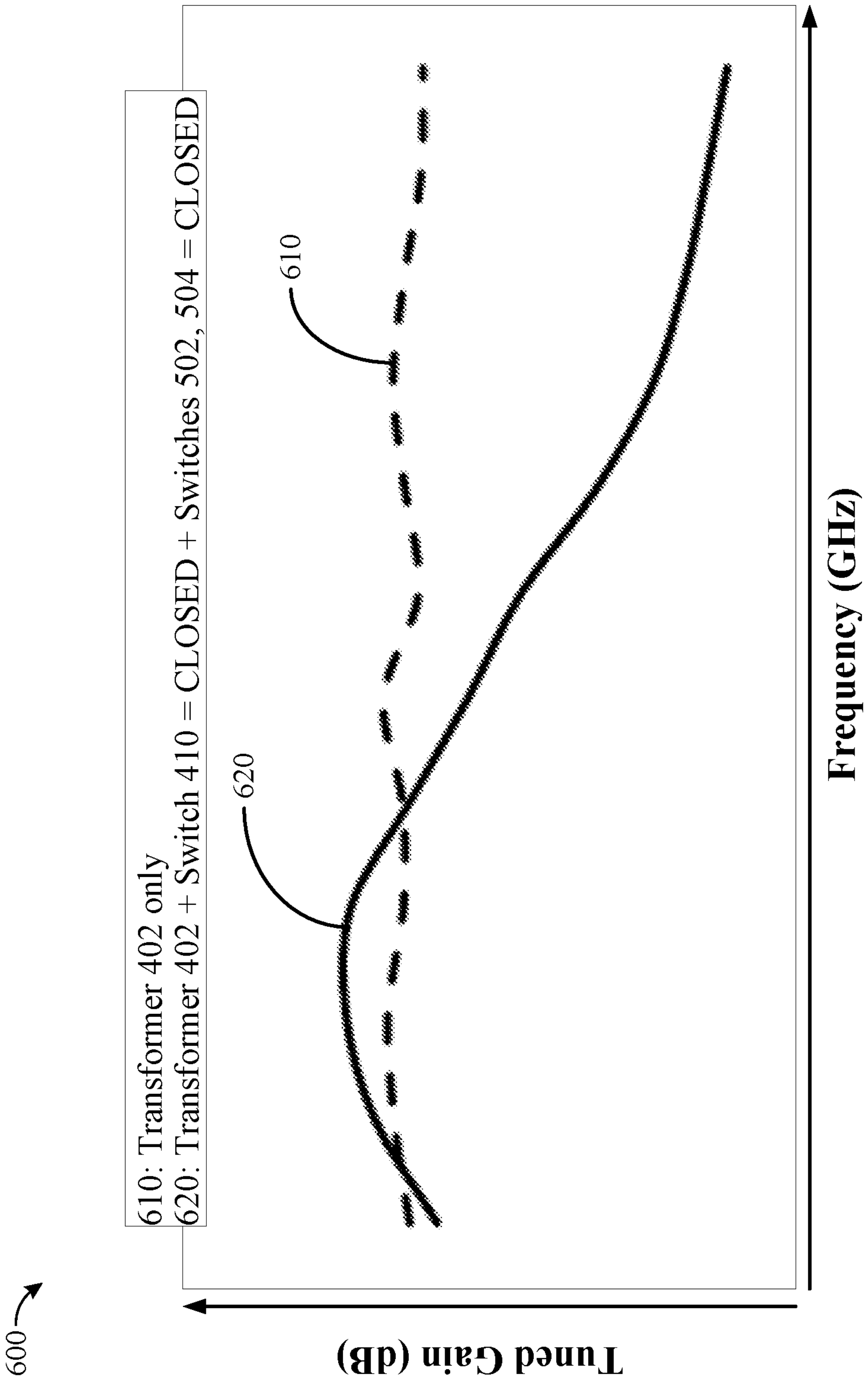
FIG. 6 illustrates a graph of different final tuned gains of an amplifier circuit, in accordance with certain aspects of the present disclosure.

FIG. 6 illustrates a graph 600 of different final tuned gains of an amplifier circuit (e.g., PA 318, amplifier 418, etc.) for different types of matching networks. In particular, graph 600 depicts (i) the tuned gain 610 of the amplifier circuit for a matching network implemented with a transformer 402 only and (ii) the tuned gain 620 of the amplifier circuit for a matching network implemented with a transformer 402, switchable inductor ring 404 having switch 410 in a closed state, switchable inductor path(s) 510 having switch(es) 502 in a closed state, and switchable inductor path(s) 520 having switch(es) 504 in a closed state. Note that the tuned gain 610 may be achieved with a matching network implemented with a transformer 402 only (e.g., without a switchable inductor ring 404, switchable inductor path(s) 510, and switchable inductor path(s) 520) or with a matching network implemented with a transformer 402, switchable inductor ring 404 having switch 410 in an open state, switchable inductor path(s) 510 having switch(es) 502 in an open state, and switchable inductor path(s) 520 having switch(es) 504 in an open state. In certain aspects, the amplifier circuit may have improved performance with a matching network described in various aspects of the present disclosure, such as matching network 540. As shown in graph 600, for example, the tuned gain 620 of the amplifier circuit has a single, more defined peak relative to the tuned gain 610 of the amplifier circuit.

Example Operations

Figure 7:
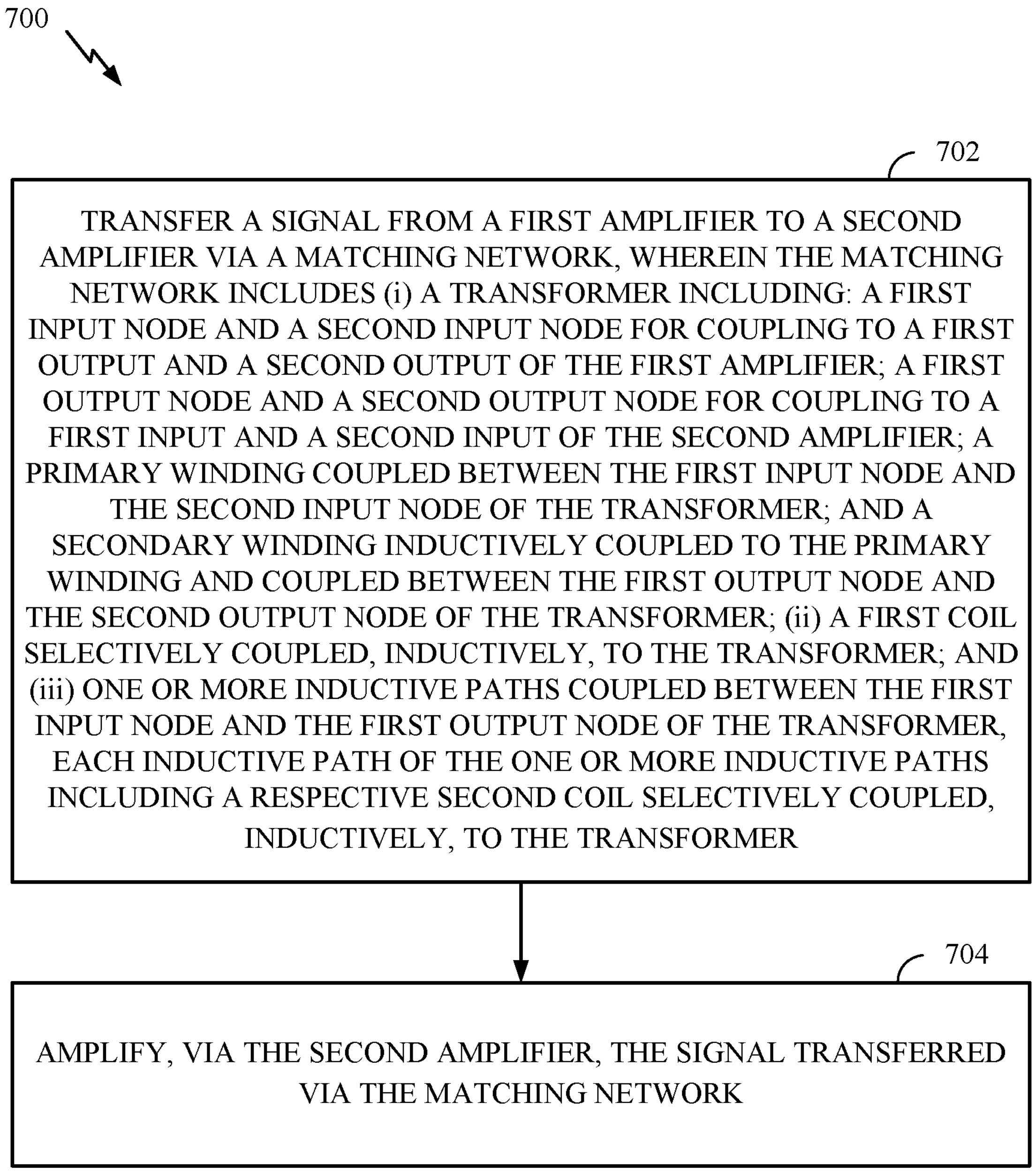
FIG. 7 is a flow diagram of example operations for amplifying a signal for transmission, in accordance with certain aspects of the present disclosure.

FIG. 7 is a flow diagram of example operations 700 for amplifying a signal for transmission, in accordance with certain aspects of the present disclosure. The operations 700 may be performed, for example, by an amplifier circuit (or amplification circuit) (e.g., amplifier circuit 500) of a transceiver (e.g., transceiver 232 and/or transceiver 254).

The operations 700 may generally involve, at block 702, transferring a signal from a first amplifier (e.g., amplifier 316 or 416) to a second amplifier (e.g., amplifier 416 or 418) via a matching network (e.g., matching network 540) of the amplifier circuit.

The matching network may include a transformer (e.g., transformer 402) including: a first input node (e.g., first input node $IN_1$) and a second input node (e.g., second input node $IN_2$) for coupling to a first output and a second output of the first amplifier; a first output node (e.g., first output node $OUT_1$) and a second output node (e.g., second output node $OUT_2$) for coupling to a first input and a second input of the second amplifier; a primary winding (e.g., primary winding $L_{pri}$) coupled between the first input node and the second input node of the transformer; and a secondary winding (e.g., secondary winding $L_{sec}$) inductively coupled to the primary winding and coupled between the first output node and the second output node of the transformer. The matching network may also include a first coil (e.g., coil $L_1$) selectively coupled, inductively, to the transformer.

The matching network may further include one or more first inductive paths (e.g., switchable inductor paths 510) coupled between the first input node and the first output node of the transformer. Each inductive path of the one or more first inductive paths may include a respective second coil (e.g., coil $L_2$) selectively coupled, inductively, to the transformer.

In some aspects, the matching network may further include one or more second inductive paths (e.g., switchable inductor paths 520) coupled between the second input node and the second output node of the transformer. Each inductive path of the one or more second inductive paths may include a respective third coil (e.g., coil $L_3$) selectively coupled, inductively, to the transformer.

The operations 700 may also involve, at block 704, amplifying, via the second amplifier, the signal transferred via the matching network.

In certain aspects, transferring the signal (at block 702) may involve at least one of (i) selectively coupling the first coil, inductively, to the transformer or (ii) selectively coupling at least one respective second coil of the one or more inductive paths, inductively, to the transformer. In some aspects, the selectively coupling of the at least one respective second coil, inductively, to the transformer may be independent of the selectively coupling of at least another respective second coil of the one or more inductive paths, inductively, to the transformer. Additionally or alternatively, in some aspects, the selectively coupling of the first coil, inductively, to the transformer may be independent of the selectively coupling of the at least one respective second coil of the one or more inductive paths, inductively, to the transformer.

Example Aspects

In addition to the various aspects described above, specific combinations of aspects are within the scope of the present disclosure, some of which are detailed below:

Aspect 1: A matching network for an amplification circuit, comprising: a transformer comprising: a first input node and a second input node for coupling to a first stage of the amplification circuit; a first output node and a second output node for coupling to a second stage of the amplification circuit; a primary winding coupled between the first input node and the second input node of the transformer; and a secondary winding inductively coupled to the primary winding and coupled between the first output node and the second output node of the transformer; a first coil selectively coupled, inductively, to the transformer; and one or more first inductive paths coupled between the first input node and the first output node of the transformer, each inductive path of the one or more first inductive paths comprising a respective second coil selectively coupled, inductively, to the transformer.

Aspect 2: The matching network of Aspect 1, further comprising one or more second inductive paths coupled between the second input node and the second output node of the transformer, each inductive path of the one or more second inductive paths comprising a respective third coil selectively coupled, inductively, to the transformer.

Aspect 3: The matching network of Aspect 2, wherein the one or more second inductive paths comprise a plurality of inductive paths, each coupled in parallel between (i) the second input node of the transformer and (ii) the second output node of the transformer.

Aspect 4: The matching network of any of Aspects 1 to 3, wherein the one or more first inductive paths comprise a plurality of inductive paths, each coupled in parallel between (i) the first input node of the transformer and (ii) the first output node of the transformer.

Aspect 5: The matching network of any of Aspects 1 to 4, wherein the first coil is disposed around the primary winding and the secondary winding of the transformer.

Aspect 6: The matching network of any of Aspects 1 to 5, further comprising a switch comprising (i) a first terminal coupled to a first terminal of the first coil and (ii) a second terminal coupled to a second terminal of the first coil, wherein the switch is configured to inductively couple the first coil to the transformer in a closed state and wherein the switch is configured to inductively decouple the first coil from the transformer in an open state.

Aspect 7: The matching network of any of Aspects 1 to 6, wherein each inductive path of the one or more first inductive paths further comprises a respective switch comprising a first terminal coupled to the respective second coil of the inductive path and a second terminal coupled to the first output node of the transformer, wherein the respective switch is configured to inductively couple the respective second coil to the transformer in a closed state, and wherein the respective switch is configured to inductively decouple the respective second coil from the transformer in an open state.

Aspect 8: The matching network of Aspect 7, wherein each inductive path of the one or more first inductive paths further comprises: a respective first capacitive element coupled between the respective second coil of the inductive path and the respective switch of the inductive path; and a respective second capacitive element coupled between the respective switch of the inductive path and the first output node of the transformer.

Aspect 9: The matching network of any of Aspects 1 to 8, wherein the one or more first inductive paths are located external to at least one of the primary winding or the secondary winding of the transformer.

Aspect 10: The matching network of any of Aspects 1 to 9, wherein the one or more first inductive paths are located external to the first coil.

Aspect 11: The matching network of any of Aspects 1 to 10, wherein the first coil is disposed around the primary winding and the secondary winding of the transformer.

Aspect 12: The matching network of any of Aspects 1 to 11, further comprising a tunable capacitive element coupled in parallel with the primary winding of the transformer.

Aspect 13: A wireless device comprising: a first amplifier; a second amplifier; and a matching network coupled between the first amplifier and the second amplifier, the matching network comprising: a transformer comprising: a first input node and a second input node for coupling to a first output and a second output of the first amplifier; a first output node and a second output node for coupling to a first input and a second input of the second amplifier; a primary winding coupled between the first input node and the second input node of the transformer; and a secondary winding inductively coupled to the primary winding and coupled between the first output node and the second output node of the transformer; a first coil selectively coupled, inductively, to the transformer; and one or more first inductive paths coupled between the first input node and the first output node of the transformer, each inductive path of the one or more first inductive paths comprising a respective second coil selectively coupled, inductively, to the transformer.

Aspect 14: The wireless device of Aspect 13, wherein the matching network further comprises one or more second inductive paths coupled between the second input node and the second output node of the transformer, each inductive path of the one or more second inductive paths comprising a respective third coil selectively coupled, inductively, to the transformer.

Aspect 15: The wireless device of any of Aspects 13 to 14, wherein the matching network further comprises a switch comprising (i) a first terminal coupled to a first terminal of the first coil and (ii) a second terminal coupled to a second terminal of the first coil, wherein the switch is configured to inductively couple the first coil to the transformer in a closed state and wherein the switch is configured to inductively decouple the first coil from the transformer in an open state.

Aspect 16: The wireless device of any of Aspects 13 to 15, wherein each inductive path of the one or more first inductive paths further comprises a respective switch comprising a first terminal coupled to the respective second coil of the inductive path and a second terminal coupled to the first output node of the transformer, wherein the respective switch is configured to inductively couple the respective second coil to the transformer in a closed state, and wherein the respective switch is configured to inductively decouple the respective second coil from the transformer in an open state.

Aspect 17: A method of wireless communication, comprising: transferring a signal from a first amplifier to a second amplifier via a matching network, wherein the matching network comprises: a transformer comprising: a first input node and a second input node for coupling to a first output and a second output of the first amplifier; a first output node and a second output node for coupling to a first input and a second input of the second amplifier; a primary winding coupled between the first input node and the second input node of the transformer; and a secondary winding inductively coupled to the primary winding and coupled between the first output node and the second output node of the transformer; a first coil selectively coupled, inductively, to the transformer; and one or more inductive paths coupled between the first input node and the first output node of the transformer, each inductive path of the one or more inductive paths comprising a respective second coil selectively coupled, inductively, to the transformer; and amplifying, via the second amplifier, the signal transferred via the matching network.

Aspect 18: The method of Aspect 17, wherein transferring the signal from the first amplifier to the second amplifier via the matching network comprises at least one of: selectively coupling the first coil, inductively, to the transformer; or selectively coupling at least one respective second coil of the one or more inductive paths, inductively, to the transformer.

Aspect 19: The method of Aspect 18, wherein the selectively coupling of the at least one respective second coil, inductively, to the transformer is independent of the selectively coupling of at least another respective second coil of the one or more inductive paths, inductively, to the transformer.

Aspect 20: The method of any of Aspects 18 to 19, wherein the selectively coupling of the first coil, inductively, to the transformer is independent of the selectively coupling of the at least one respective second coil of the one or more inductive paths, inductively, to the transformer.

The above description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components. For example, means for transferring a signal from a first amplifier to a second amplifier may include a matching network, such as the matching network 340 of FIG. 3 or the matching network 540 of FIG. 5. Means for selectively coupling may include a switch, such as the switch 410 of FIG. 4, the switch 502 of FIG. 5, or the switch 504 of FIG. 5. Means for controlling a switch may include a controller (or processor), such as the controller 336 of FIG. 3. Means for amplifying the signal transferred via the matching network may include an amplifier, such as the PA 318 of FIG. 3 or the amplifier 418 of FIG. 4 or 5.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, "a processor," "at least one processor," or "one or more processors" generally refers to a single processor configured to perform one or multiple operations or multiple processors configured to collectively perform one or more operations. In the case of multiple processors, performance of the one or more operations could be divided amongst different processors, though one processor may perform multiple operations, and multiple processors could collectively perform a single operation. Similarly, "a memory," "at least one memory," or "one or more memories" generally refers to a single memory configured to store data and/or instructions or multiple memories configured to collectively store data and/or instructions.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A matching network for an amplification circuit, comprising:
- a transformer comprising:
  - a first input node and a second input node for coupling to a first stage of the amplification circuit;
  - a first output node and a second output node for coupling to a second stage of the amplification circuit;
  - a primary winding coupled between the first input node and the second input node of the transformer; and
  - a secondary winding inductively coupled to the primary winding and coupled between the first output node and the second output node of the transformer;
- a first coil selectively coupled, inductively, to the transformer; and
- one or more first inductive paths coupled between the first input node and the first output node of the transformer, each inductive path of the one or more first inductive paths comprising a respective second coil selectively coupled, inductively, to the transformer.

2. The matching network of claim 1, further comprising one or more second inductive paths coupled between the second input node and the second output node of the transformer, each inductive path of the one or more second inductive paths comprising a respective third coil selectively coupled, inductively, to the transformer.

3. The matching network of claim 2, wherein the one or more second inductive paths comprise a plurality of inductive paths, each coupled in parallel between (i) the second input node of the transformer and (ii) the second output node of the transformer.

4. The matching network of claim 1, wherein the one or more first inductive paths comprise a plurality of inductive paths, each coupled in parallel between (i) the first input node of the transformer and (ii) the first output node of the transformer.

5. The matching network of claim 1, wherein the first coil is disposed around the primary winding and the secondary winding of the transformer.

6. The matching network of claim 1, further comprising a switch comprising (i) a first terminal coupled to a first terminal of the first coil and (ii) a second terminal coupled to a second terminal of the first coil, wherein the switch is configured to inductively couple the first coil to the transformer in a closed state and wherein the switch is configured to inductively decouple the first coil from the transformer in an open state.

7. The matching network of claim 1, wherein each inductive path of the one or more first inductive paths further comprises a respective switch comprising a first terminal coupled to the respective second coil of the inductive path and a second terminal coupled to the first output node of the transformer, wherein the respective switch is configured to inductively couple the respective second coil to the transformer in a closed state, and wherein the respective switch is configured to inductively decouple the respective second coil from the transformer in an open state.

8. The matching network of claim 7, wherein each inductive path of the one or more first inductive paths further comprises:
- a respective first capacitive element coupled between the respective second coil of the inductive path and the respective switch of the inductive path; and
- a respective second capacitive element coupled between the respective switch of the inductive path and the first output node of the transformer.

9. The matching network of claim 1, wherein the one or more first inductive paths are located external to at least one of the primary winding or the secondary winding of the transformer.

10. The matching network of claim 1, wherein the one or more first inductive paths are located external to the first coil.

11. The matching network of claim 10, wherein the first coil is disposed around the primary winding and the secondary winding of the transformer.

12. The matching network of claim 1, further comprising a tunable capacitive element coupled in parallel with the primary winding of the transformer.

13. A wireless device comprising:
- a first amplifier;
- a second amplifier; and
- a matching network coupled between the first amplifier and the second amplifier, the matching network comprising:
  - a transformer comprising:
    - a first input node and a second input node for coupling to a first output and a second output of the first amplifier;
    - a first output node and a second output node for coupling to a first input and a second input of the second amplifier;
    - a primary winding coupled between the first input node and the second input node of the transformer; and
    - a secondary winding inductively coupled to the primary winding and coupled between the first output node and the second output node of the transformer;
  - a first coil selectively coupled, inductively, to the transformer; and
  - one or more first inductive paths coupled between the first input node and the first output node of the transformer, each inductive path of the one or more first inductive paths comprising a respective second coil selectively coupled, inductively, to the transformer.

14. The wireless device of claim 13, wherein the matching network further comprises one or more second inductive paths coupled between the second input node and the second output node of the transformer, each inductive path of the one or more second inductive paths comprising a respective third coil selectively coupled, inductively, to the transformer.

15. The wireless device of claim 13, wherein the matching network further comprises a switch comprising (i) a first terminal coupled to a first terminal of the first coil and (ii) a second terminal coupled to a second terminal of the first coil, wherein the switch is configured to inductively couple the first coil to the transformer in a closed state and wherein the switch is configured to inductively decouple the first coil from the transformer in an open state.

16. The wireless device of claim 13, wherein each inductive path of the one or more first inductive paths further comprises a respective switch comprising a first terminal coupled to the respective second coil of the inductive path and a second terminal coupled to the first output node of the transformer, wherein the respective switch is configured to inductively couple the respective second coil to the transformer in a closed state, and wherein the respective switch is configured to inductively decouple the respective second coil from the transformer in an open state.

17. A method of wireless communication, comprising:

transferring a signal from a first amplifier to a second amplifier via a matching network, wherein the matching network comprises:

a transformer comprising:

a first input node and a second input node for coupling to a first output and a second output of the first amplifier;

a first output node and a second output node for coupling to a first input and a second input of the second amplifier;

a primary winding coupled between the first input node and the second input node of the transformer; and a secondary winding inductively coupled to the primary winding and coupled between the first output node and the second output node of the transformer;

a first coil selectively coupled, inductively, to the transformer; and one or more inductive paths coupled between the first input node and the first output node of the transformer, each inductive path of the one or more inductive paths comprising a respective second coil selectively coupled, inductively, to the transformer; and amplifying, via the second amplifier, the signal transferred via the matching network.

18. The method of claim 17, wherein transferring the signal from the first amplifier to the second amplifier via the matching network comprises at least one of:

selectively coupling the first coil, inductively, to the transformer; or selectively coupling at least one respective second coil of the one or more inductive paths, inductively, to the transformer.

19. The method of claim 18, wherein the selectively coupling of the at least one respective second coil, inductively, to the transformer is independent of the selectively coupling of at least another respective second coil of the one or more inductive paths, inductively, to the transformer.

20. The method of claim 18, wherein the selectively coupling of the first coil, inductively, to the transformer is independent of the selectively coupling of the at least one respective second coil of the one or more inductive paths, inductively, to the transformer.

* * * * *